United States Patent
Larson (10) Patent No.: US 9,728,933 B2
(45) Date of Patent: Aug. 8, 2017

(54) TUNABLE LASER SOURCE

(71) Applicant: Lumentum Operations LLC, Milpitas, CA (US)

(72) Inventor: Michael C. Larson, Oakland, CA (US)

(73) Assignee: Lumentum Operations LLC, Milpitas, CA (US)

(*) Notice: Subject to any disclaimer, the term of this patent is extended or adjusted under 35 U.S.C. 154(b) by 0 days.

(21) Appl. No.: 15/094,591

(22) Filed: Apr. 8, 2016

(65) Prior Publication Data

US 2016/0226218 A1 Aug. 4, 2016

Related U.S. Application Data

(62) Division of application No. 14/502,190, filed on Sep. 30, 2014, now Pat. No. 9,312,662.

(51) Int. Cl.
*H01S 5/00* (2006.01)
*H01S 5/50* (2006.01)
(Continued)

(52) U.S. Cl.
CPC ........ *H01S 5/0078* (2013.01); *G02B 6/29352* (2013.01); *G02B 6/29355* (2013.01); *G02B 6/29389* (2013.01); *G02B 6/29395* (2013.01); *G02B 26/001* (2013.01); *H01S 3/1055* (2013.01); *H01S 5/026* (2013.01);
(Continued)

(58) Field of Classification Search
CPC ... H01S 5/0078; H01S 5/06787; H01S 5/5054
See application file for complete search history.

(56) References Cited

U.S. PATENT DOCUMENTS 5,136,598 A 8/1992 Weller et al.
5,325,392 A 6/1994 Tohmori et al.
(Continued)

FOREIGN PATENT DOCUMENTS

CA 2380374 A1 4/2001
EP 1364432 A2 11/2003
(Continued)

OTHER PUBLICATIONS

T. Okamato et al., "Monolithic Integration of a 10 Gb/s Mach-Zehnder Modulator and a Widely Tunable Laser based on a 2-Ring Loop-Filter", International Conference on Indium Phosphide and Related Materials, 2010, 3 pages.
(Continued)

*Primary Examiner* — Eric Bolda
(74) *Attorney, Agent, or Firm* — Harrity & Harrity, LLP (57) ABSTRACT

A tunable transmission optical filter is optically coupled between a laser section and semiconductor optical amplifier (SOA) section of a tunable laser device. The optical filter may be tuned to provide a high transmission near the lasing peak while suppressing a significant portion of back-propagating amplified spontaneous emission (ASE) of the SOA section. Without the optical filter, the laser output spectrum may develop side lobes of higher intensity after the ASE is amplified and reflected in the forward direction by the laser gain and mirror sections. While lessening the side lobes, the optical filter simultaneously transmits the laser peak for amplification by the SOA section.

20 Claims, 8 Drawing Sheets

(51) Int. Cl.

| | | |
|---|---|---|
| G02B 6/293 | (2006.01) | |
| G02B 26/00 | (2006.01) | |
| H01S 5/026 | (2006.01) | |
| H01S 5/0625 | (2006.01) | |
| H01S 5/0687 | (2006.01) | |
| H01S 5/12 | (2006.01) | |
| H01S 5/125 | (2006.01) | |
| H01S 3/1055 | (2006.01) | |

(52) U.S. Cl.
CPC ........ *H01S 5/0687* (2013.01); *H01S 5/06256* (2013.01); *H01S 5/125* (2013.01); *H01S 5/1209* (2013.01); *H01S 5/50* (2013.01); *H01S 5/5045* (2013.01); *H01S 2301/02* (2013.01)

(56) References Cited

U.S. PATENT DOCUMENTS

| | | | |
|---|---|---|---|
| 5,661,741 A | 8/1997 | Kakimoto | |
| 5,748,660 A | 5/1998 | Delorme et al. | |
| 6,208,454 B1 | 3/2001 | Koren et al. | |
| 6,359,724 B1 | 3/2002 | Katagiri et al. | |
| 6,580,739 B1 | 6/2003 | Coldren | |
| 6,590,924 B2 | 7/2003 | Fish et al. | |
| 6,614,819 B1 | 9/2003 | Fish et al. | |
| 6,628,690 B1 | 9/2003 | Fish et al. | |
| 6,654,400 B1 | 11/2003 | Mason et al. | |
| 6,658,035 B1 | 12/2003 | Mason et al. | |
| 6,687,267 B2 | 2/2004 | Bukkems | |
| 6,687,278 B1 | 2/2004 | Mason et al. | |
| 6,690,693 B1 | 2/2004 | Crowder | |
| 6,714,566 B1 | 3/2004 | Coldren et al. | |
| 6,728,279 B1 | 4/2004 | Sarlet et al. | |
| 6,788,719 B2 | 9/2004 | Crowder | |
| 6,822,980 B2 | 11/2004 | Lundqvist | |
| 6,868,100 B2 | 3/2005 | Larson et al. | |
| 6,909,734 B2 | 6/2005 | Coldren et al. | |
| 6,934,033 B2 | 8/2005 | McDaniel et al. | |
| 6,937,638 B2 | 8/2005 | Fish et al. | |
| 7,058,096 B2 | 6/2006 | Sarlet et al. | |
| 7,130,325 B2 | 10/2006 | Oh et al. | |
| 7,174,058 B2 | 2/2007 | Coldren et al. | |
| 7,230,963 B2 | 6/2007 | Menon et al. | |
| 7,457,339 B2 | 11/2008 | Arimoto | |
| 7,478,007 B2 | 1/2009 | Farrell et al. | |
| 7,539,369 B2 | 5/2009 | Yamazaki | |
| 7,633,988 B2 | 12/2009 | Fish et al. | |
| 7,643,532 B2 | 1/2010 | Fish et al. | |
| 8,295,315 B2 | 10/2012 | Ward et al. | |
| 8,311,071 B2 | 11/2012 | Kato | |
| 8,358,461 B2 | 1/2013 | Huber et al. | |
| 8,368,995 B2 | 2/2013 | Dallesasse et al. | |
| 8,379,300 B2 | 2/2013 | Ishizaka | |
| 8,543,010 B2 | 9/2013 | Zhou et al. | |
| 9,312,662 B1 | 4/2016 | Larson | |
| 2002/0054614 A1 | 5/2002 | Jin | |
| 2002/0085609 A1 | 7/2002 | Ksendzov et al. | |
| 2004/0057477 A1 | 3/2004 | Barron et al. | |
| 2007/0183781 A1 | 8/2007 | Zeng et al. | |
| 2007/0206951 A1* | 9/2007 | Lin | H04B 10/25758 398/115 |
| 2009/0122817 A1 | 5/2009 | Sato et al. | |
| 2009/0141266 A1 | 6/2009 | Lin et al. | |
| 2009/0245298 A1 | 10/2009 | Sysak et al. | |
| 2011/0292960 A1 | 12/2011 | Shoji et al. | |
| 2012/0063474 A1 | 3/2012 | Ayotte et al. | |
| 2012/0294320 A1 | 11/2012 | Corbett et al. | |
| 2013/0011947 A1 | 1/2013 | Yanagisawa | |
| 2013/0094527 A1 | 4/2013 | Fukuda et al. | |
| 2013/0094528 A1 | 4/2013 | Ikagawa et al. | |
| 2014/0028997 A1 | 1/2014 | Cable et al. | |
| 2014/0050236 A1 | 2/2014 | Beckett | |
| 2014/0050237 A1 | 2/2014 | Cao et al. | |
| 2014/0254617 A1 | 9/2014 | Oh | |
| 2016/0301189 A1* | 10/2016 | Cable | G01B 9/02091 |

FOREIGN PATENT DOCUMENTS

| | | |
|---|---|---|
| EP | 1442509 B1 | 6/2005 |
| EP | 2431775 A1 | 3/2012 |
| JP | 2004126172 A | 4/2001 |
| WO | 2007107186 A1 | 9/2007 |
| WO | 2014018939 A2 | 1/2014 |
| WO | WO 2014/018945 A1 | 1/2014 |

OTHER PUBLICATIONS

Extended European Search Report corresponding to EP 14200180.9, mailed Aug. 4, 2016, 12 pages.

* cited by examiner

TUNABLE LASER SOURCE

RELATED APPLICATION

This application is a divisional of U.S. application Ser. No. 14/502,190, filed Sep. 30, 2014 (now U.S. Pat. No. 9,312,662), the disclosure of which is incorporated herein by reference.

TECHNICAL FIELD

The present disclosure relates to light sources, and in particular, to tunable laser sources.

BACKGROUND

In a wavelength division multiplexed (WDM) optical network, optical signals at a plurality of wavelengths are encoded with digital streams of information. These encoded optical signals, or "wavelength channels", are combined and transmitted through a series of spans of optical fiber. At a receiver end, the wavelength channels are separated and detected by optical receivers.

The optical signals to be encoded are usually provided by laser diodes, one laser diode per one wavelength channel. It is desirable to provide backup laser diodes for redundancy purposes. In view of multiple wavelengths used in a dense WDM (DWDM) transmission, tens and even hundreds of wavelengths in some cases, providing a separate backup laser diode for each wavelength may become prohibitively expensive. Tunable laser sources help solve this problem.

Tunable laser sources also prove valuable in reconfigurable WDM optical networks, in which new wavelength channels are added as a network load increases. Adding and dropping wavelength channels in such a "wavelength-agile" network may be done dynamically, in response to fluctuating data bandwidth requirements between various network nodes. From the network architecture standpoint, it may be preferable to have laser sources tunable to any desired wavelength. Such sources have to be widely tunable, provide sufficient output optical power, and have strong side mode suppression to avoid coherent crosstalk with other wavelength channels.

Figure 1A:
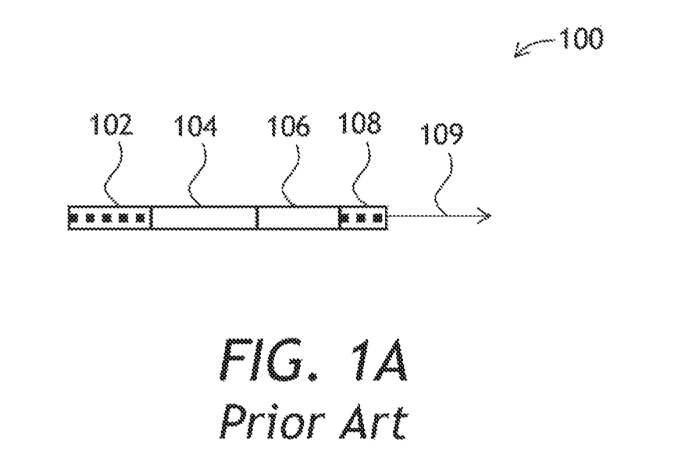
FIG. 1A illustrates a schematic block diagram of a prior-art tunable laser source.
Figure 1B:
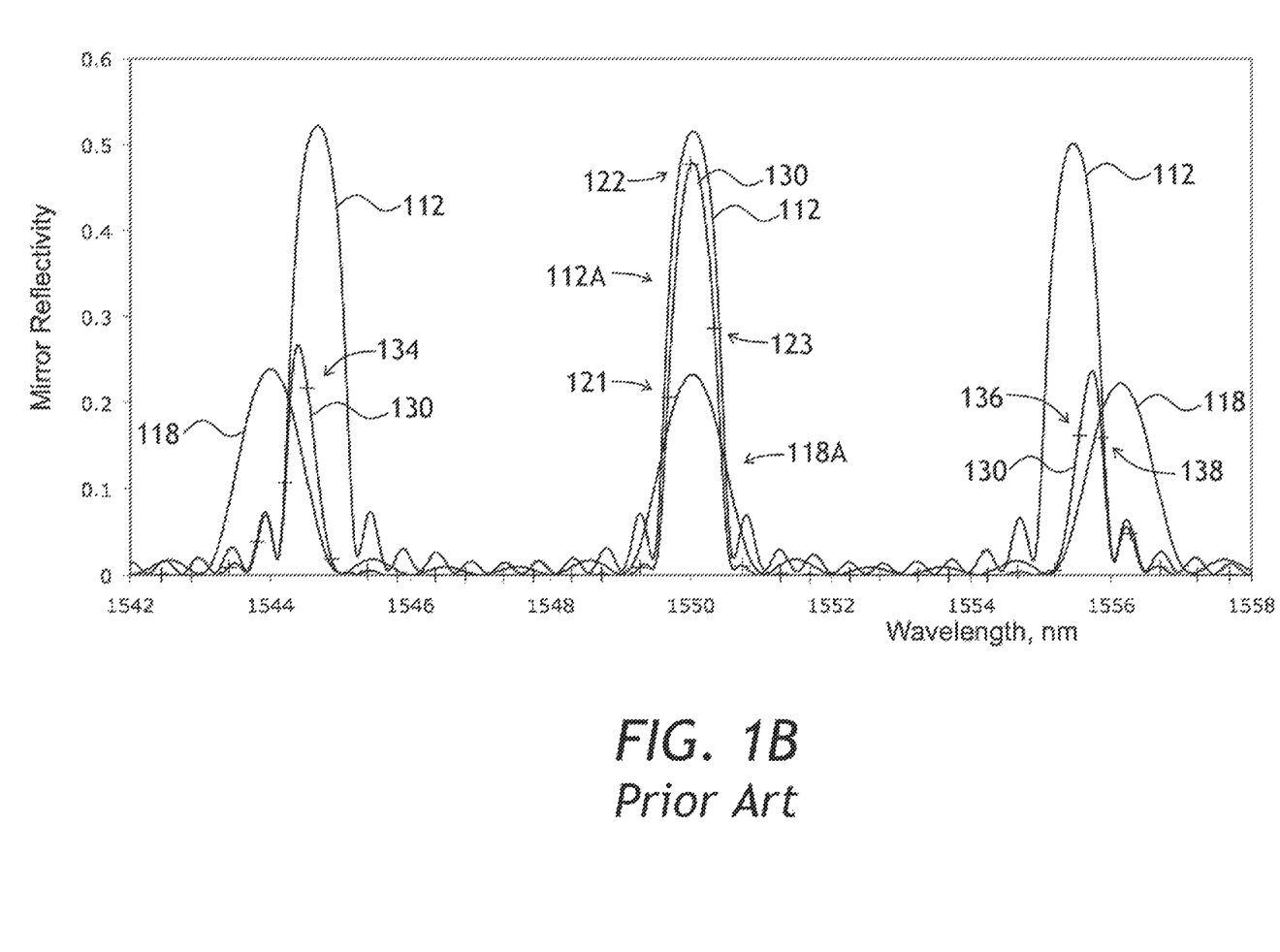
FIG. 1B illustrates mirror reflection spectra, the product spectrum at 4× scale, and longitudinal mode positions of the laser source of FIG. 1A.

Referring to FIG. 1A, an exemplary prior-art tunable laser source 100 is shown. A similar laser source is described, for example, in U.S. Pat. No. 5,325,392 by Tohmori et al. The laser source 100 includes optically serially coupled a rear mirror 102, again section 104, a phase section 106, and a front mirror 108. The front 108 and rear 102 mirrors include optical gratings having a periodic wavelength dependence of reflectivity. Turning to FIG. 1B, an example wavelength dependence 112 of the rear mirror 102 reflectivity has a period of 5.6 nm. A wavelength dependence 118 of the front mirror 108 reflectivity has a larger period of 6.3 nm. Peaks 112A, 118A of the wavelength dependencies 112 and 118 overlap at 1550 nm. As a result, a product wavelength dependence 130, obtained by multiplying the rear 112 and front 118 wavelength dependences, has its biggest peak 132 at 1550 nm. The product wavelength dependence 130 is shown in FIG. 1B magnified by a factor of four. The product wavelength dependence 130 is proportional to a round trip optical gain for light circulating between the front 108 and rear 102 mirrors of the laser source 100 (FIG. 1A). The product wavelength dependence 130 (FIG. 1B) determines wavelength emission properties of the laser source 100. Three longitudinal resonator modes 121, 122, and 123, denoted with cross ("+") signs superimposed on the product reflectivity trace 130, are disposed within the 1550 nm peaks 112A, 118A. Additional modes 134, 136, and 138 are present near 1544 nm (134) and 1556 nm (136, 138). Of these modes 121, 122, and 123, 134, 136, and 138, only the central mode 122 results in generation of a laser beam 109 of substantial optical power due to its much higher round trip gain; emission at the side mode 122, 123, 134, 136, and 138 wavelengths occurs at much lower optical power level.

The laser source 100 is tuned by shifting the wavelength dependencies 112 and 118 in opposite directions. When two other peaks of the wavelength dependencies 112 and 118 overlap at another wavelength, lasing occurs at one of longitudinal modes at that wavelength. In essence, the lasing wavelength is tuned using a Vernier effect over wavelength range that is much wider than a wavelength range of tuning the individual mirrors 102, 108 themselves. The wavelength tuning occurs in stepwise fashion. A proper selection of longitudinal mode spacing and reflectivity periods of the back 102 and front 108 mirrors allows one to define a desired magnitude of the wavelength step.

Figure 1C:
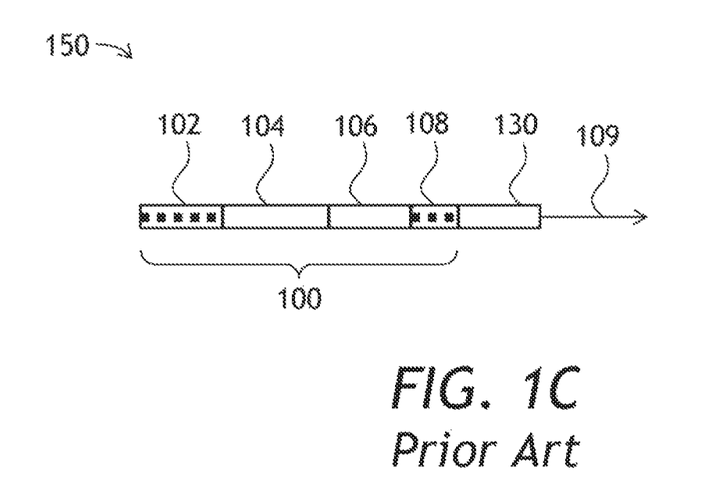
FIG. 1C illustrates a schematic block diagram of a prior-art amplified tunable laser source.

Referring now to FIG. 1C with further reference to FIG. 1A, an exemplary prior-art amplified laser source 150 is shown. A similar laser source is described, for example, in U.S. Pat. No. 6,788,719 by Crowder. The amplified laser source 150 includes the laser source 100 of FIG. 1A and an integrated semiconductor optical amplifier (SOA) 130 serially optically coupled to the front mirror 108. The addition of the SOA 130 allows one to boost the output power of the laser beam 109 to much higher levels than those achievable in the laser source 100 of FIG. 1A. However, the SOA 130 generates additional spontaneous emission noise. Furthermore, the amplification by the SOA 130 is not spectrally uniform across an amplification band due to so-called gain tilt. As a result, the SOA 130 may amplify side modes of the laser beam 109 more than the fundamental mode, reducing side mode suppression ratio (SMSR). For example, the SMSR may be reduced from 50 dB in the laser source 100 to less than 40 dB in the amplified laser source 150 for lasing wavelengths away from the gain spectrum peak. The SMSR degradation may be unacceptable in many applications including a tunable laser source application for a wavelength-agile optical network. A tradeoff exists in the prior art between output optical power and spectral purity of an amplified widely tunable laser source.

SUMMARY

In accordance with one embodiment, a tunable transmission optical filter is optically coupled between a laser section and an SOA section of a tunable laser device. The optical filter may be tuned to have high transmission near the lasing wavelength, and it may be configured for low transmission proximate the gain peak for lasing wavelengths substantially detuned from the gain peak wavelength. This suppresses back-propagating amplified spontaneous emission (ASE) of the SOA near the filter stop band, which would otherwise be reflected forward by the laser mirrors and amplified by laser active section. This back-reflected ASE may be a major source of SMSR degradation. In general, ASE-induced degradation of SMSR is most extreme at the shortest and/or longest wavelengths of the laser tuning range when the lasing wavelength is detuned farthest from the peak gain. In effect, the placement of the tunable transmission optical filter between the laser section and the SOA doubles the ASE suppression, resulting in a corresponding increase of the SMSR. Preferably, the laser section, the tunable transmission optical filter, and the SOA section are monolithically formed as a single structure, simplifying overall construction and eliminating reflections between components.

In accordance with an embodiment, there is provided a tunable laser device comprising:

a tunable laser section configured to generate light at a lasing wavelength, wherein the tunable loser comprises an optical cavity for tuning the lasing wavelength within a tuning range spanning from a first wavelength to a second wavelength, wherein the second wavelength is longer than the first wavelength;

a tunable transmission optical filter disposed outside of the optical cavity and downstream of the tunable laser section, wherein the tunable transmission optical filter comprises:

a passband configured to transmit light at the lasing wavelength, and a stopband configured to attenuate light at a sidelobe wavelength of the tunable laser section, wherein the sidelobe wavelength is different from the lasing wavelength, and wherein the lasing wavelength and the sidelobe wavelength are within the tuning range; and a semiconductor optical amplifier (SOA) section optically coupled to and downstream of the tunable transmission optical filter, wherein the semiconductor optical amplifier section has an amplification band that comprises the tuning range.

In one exemplary embodiment, the tunable transmission optical filter comprises an asymmetric Mach-Zehnder waveguide interferometer, formed monolithically with the tunable laser and SOA sections. The Mach-Zehnder waveguide interferometer is tunable to have a transmission maximum at the lasing wavelength, or a transmission minimum, e.g. a center of the stopband, at the sidelobe wavelength.

In accordance with one embodiment, there is further provided a laser source comprising the above tunable laser device and a controller operationally coupled to the tunable laser section, the tunable transmission optical filter, and the semiconductor optical amplifier, wherein the controller is configured to:

tune the losing wavelength of the tunable laser section; and tune a center wavelength of the passband of the tunable transmission optical filter by adjusting a first tuning parameter thereof to correspond to the lasing wavelength.

In accordance with an embodiment, there is further provided a method for calibrating a tunable laser device comprising coupled in sequence a tunable laser section, a tunable transmission optical filter, and a semiconductor optical amplifier section, the method comprising:

(a) tuning a lasing wavelength of the tunable laser section to a calibration wavelength within a tuning range of the tunable laser section;

(b) upon completion of step (a), scanning a center wavelength of a passband of the tunable transmission optical filter;

(c) while performing step (b), determining an output optical power or a side mode suppression ratio of the laser source;

(d) selecting a value of the center wavelength scanned in step (b) corresponding to a maximum output optical power or a maximum side mode suppression ratio determined in step (c); and (e) associating the value of the center wavelength selected in step (d) with the calibration wavelength tuned to in step (a).

In accordance with another aspect, there is further provided a method for generating light comprising:

(a) providing a tunable laser device comprising coupled in sequence a tunable laser section, a tunable transmission optical filter, and a semiconductor optical amplifier section;

(b) energizing the tunable laser section and tuning a losing wavelength thereof to a first working wavelength within a tuning range of the tunable laser section;

(c) tuning a passband center wavelength of the tunable transmission optical filter so as to increase a side mode suppression ratio at the first working wavelength; and (d) energizing the semiconductor optical amplifier section.

BRIEF DESCRIPTION OF THE DRAWINGS

Exemplary embodiments will now be described in conjunction with the drawings, in which.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 2A:
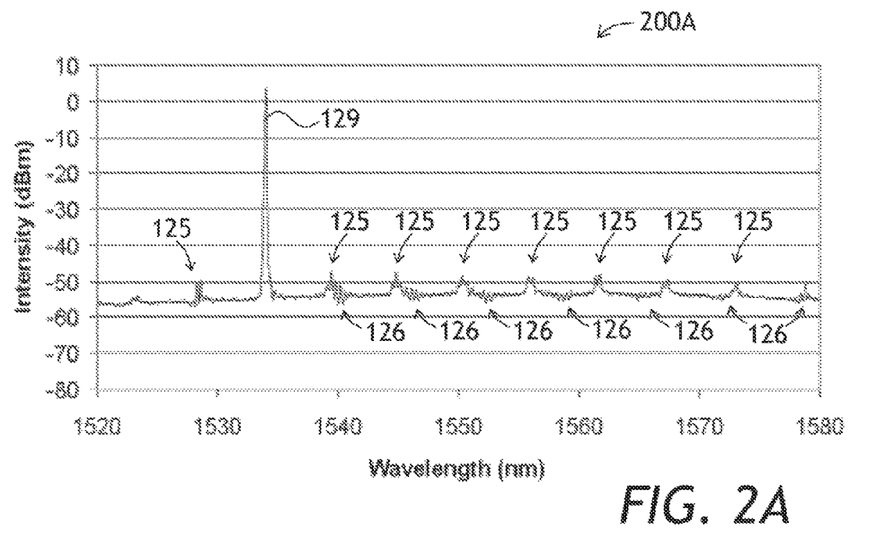
FIG. 2A illustrates a typical emission spectrum of the laser source of FIG. 1A.

The source of SMSR degradation caused by the addition of an SOA to a Vernier-tunable laser diode will be considered first. Turning to FIG. 2A, an example emission spectrum 200A of the laser source 100 of FIG. 1A is shown. The emission spectrum 200A was measured by the inventors. The emission spectrum 200A has a main lasing peak 129; back mirror reflection side peaks 125; and front mirror reflection side peaks 126. In FIG. 2A, the laser peak 129 is located near the short wavelength edge. e.g. 1530 nm, of the tuning range spanning e.g. between 1530 and 1570 nm, resulting in an overall SMSR of about 50 dB.

Figure 2B:
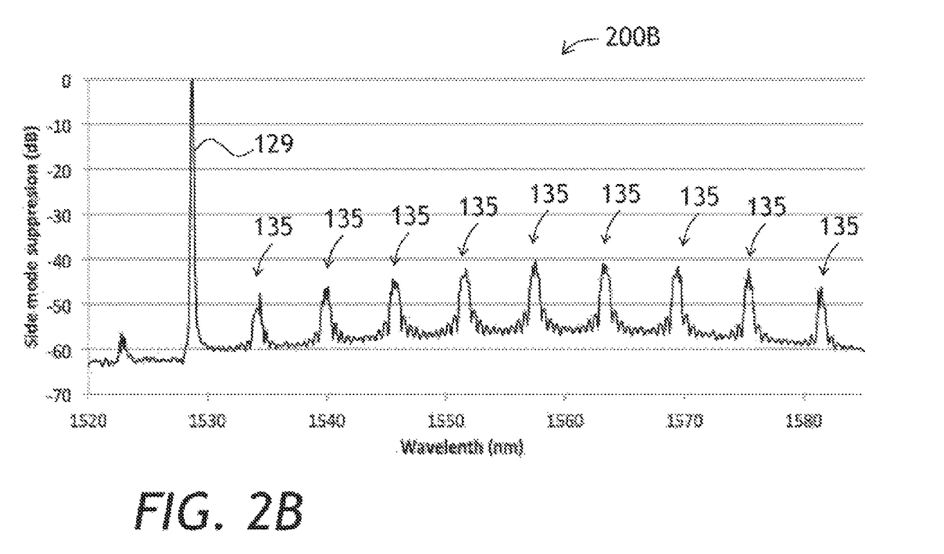
FIG. 2B illustrates a typical emission spectrum of the laser source of FIG. 1C.

Turning to FIG. 2B, an emission spectrum 200B of the amplified laser source 150 of FIG. 1C is shown. The emission spectrum 200B was measured by the inventors under a similar short-wavelength tuning condition. Side peaks 135 are caused by the ASE from the SOA 130 propagating back through the gain section 104 towards the rear mirror 102, reflecting from the rear mirror 102, propagating again through the gain section 104 and the SOA 130. This double-pass amplification of the ASE in the gain section 104 and, at least partially, in the SOA 130, results in a reduction of the SMSR to a value of only 40 dB. The SMSR value of 40 dB may be insufficient in wavelength-agile applications.

Figure 3:
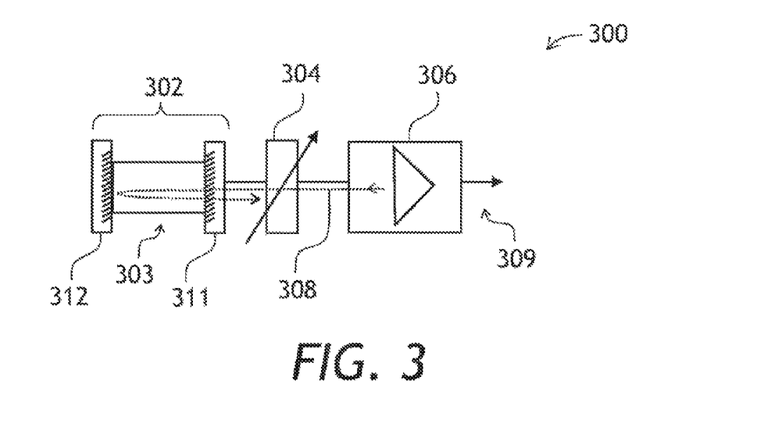
FIG. 3 illustrates a schematic block diagram of a tunable laser device having a tunable filter.

Referring now to FIG. 3, a tunable laser device 300 may be provided as described below. For example, the tunable laser device 300 embodiment includes optically coupled (in sequence) a tunable laser section 302, a tunable transmission optical filter 304, and a SOA section 306. The tunable laser section 302 may include an optical cavity 303 for tuning a lasing wavelength $\lambda_{output}$ within a tuning range $\Delta\lambda$ spanning from a first wavelength $\lambda_1$ to a second wavelength $\lambda_2 > \lambda_1$. The optical cavity 303 may include from 311 and rear 332 mirrors. The tunable transmission optical filter 304 is disposed outside of the optical cavity 303 and downstream of the tunable laser section 302. The tunable transmission optical filter 304 has a passband for transmitting light at the lasing wavelength $X\lambda_{output}$, and a stopband for attenuating light at a sidelobe wavelength $\lambda_S$ of the tunable laser section, different from the lasing wavelength $\lambda_{output}$. Both the lasing $\lambda_{output}$ and sidelobe $\lambda_S$ wavelengths are within the tuning range $\Delta\lambda$. The SOA section 306 is disposed downstream of the tunable transmission optical filter 304. The SOA section 306 has an amplification band including the tuning range $\Delta\lambda$.

In operation, the tunable laser section 302 generates light at the lasing wavelength $\lambda_{output}$. The tunable transmission optical filter 304 transmits the light at the lasing wavelength $\lambda_{output}$ while attenuating light at a sidelobe wavelength $\lambda_S$. The SOA 306 may amplify the laser light, producing an output laser beam 309. ASE 308 at the sidelobe wavelength $\lambda_S$ generated by the SOA section 306 may propagate through the tunable transmission optical filter 304, gets attenuated by the tunable transmission optical filter 304, reflects from the rear mirror 312, propagates again through the tunable transmission optical filter 304, and gets attenuated again. In accordance with one embodiment, the double attenuation of the ASE 108 at the sidelobe wavelength $\lambda_S$ by the tunable transmission optical filter 304 may result in a considerable SMSR improvement. Of course, not only one sidelobe wavelength $\lambda_S$, but many such wavelengths different from the lasing wavelength $\lambda_{output}$ within the stopband may be attenuated by the tunable transmission optical filter 304, depending on wavelength selective properties of the optical cavity 303 and a spectral shape of the tunable transmission optical filter 304.

Figure 4A:
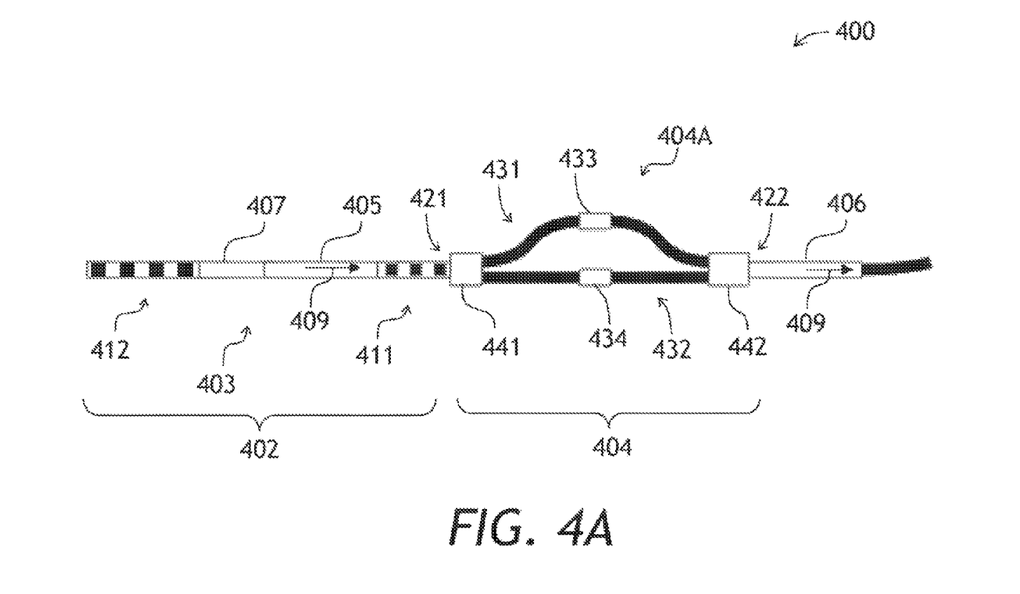
FIG. 4A illustrates an implementation of the tunable laser device of FIG. 3, wherein the tunable filter includes an asymmetric Mach-Zehnder (MZ) interferometer.

Turning to FIG. 4A, a tunable monolithic laser device 400 is a preferred embodiment of the tunable monolithic laser device 300 of FIG. 3. An optical cavity 403 of the tunable monolithic laser device 400 of FIG. 4 includes front 411 and rear 412 tunable sampled grating mirrors having different tunable periods of corresponding reflection wavelengths for tuning the lasing wavelength $\lambda_{output}$ via Vernier effect. The tunable laser section 402 includes a gain section 405 and a phase section 407 optically coupled between the front 411 and rear 412 tunable sampled grating mirror. A main function of the gain section 405 is to provide optical gain at the lasing wavelength $\lambda_{output}$. A main function of the phase section 407 is to adjust the optical path length of the optical cavity 403 to provide an efficient wavelength tuning. The tunable monolithic laser device 400 further includes a tunable transmission optical filter 404 and an SOA section 406. The tunable laser section 402, the tunable transmission optical filter 404, and the SOA section 406 form a monolithic structure. By way of example, me tunable laser section 402, the tunable transmission optical filter 404, and the SOA section 406 may be disposed, and monolithically formed, on a common semiconductor substrate, not shown.

In the embodiment of FIG. 4A, the tunable transmission optical filter 404 is implemented as an asymmetric Mach-Zehnder waveguide interferometer 404A including an input port 421 optically coupled to the front tunable sampled grating mirror 411, an output port 422 optically coupled to the SOA section 406, first 431 and second 432 branch waveguides having different optical path lengths, an input coupler 441 configured to optically couple the input port 421 to the first 431 and second 432 branch waveguides, and an output coupler 442 configured to optically couple the first 431 and second 432 branch waveguides to the output port 422. For tuning, the asymmetric tunable Mach-Zehnder waveguide interferometer 404A includes phase adjusters 433 and 434, configured to adjust an optical path length difference between the first 431 and second 432 branch waveguides. At least one phase adjuster 433 or 434 may be provided.

In operation, the front 411 and rear 412 tunable sampled grating mirrors are tuned to have a reflection overlap at a particular desired lasing wavelength $\lambda_{output}$. The gain section 405 provides sufficient optical gain to overcome losses in the optical cavity 403. The phase section 407 may be tuned to place a longitudinal mode of the optical cavity 403 at a maximum reflection wavelength of the overlapping reflection peaks of the front 411 and rear 412 tunable sampled grating mirrors. Laser light 409 propagates through the asymmetric Mach-Zehnder waveguide interferometer 404A and may be amplified by the SOA section 406.

Figure 4B:
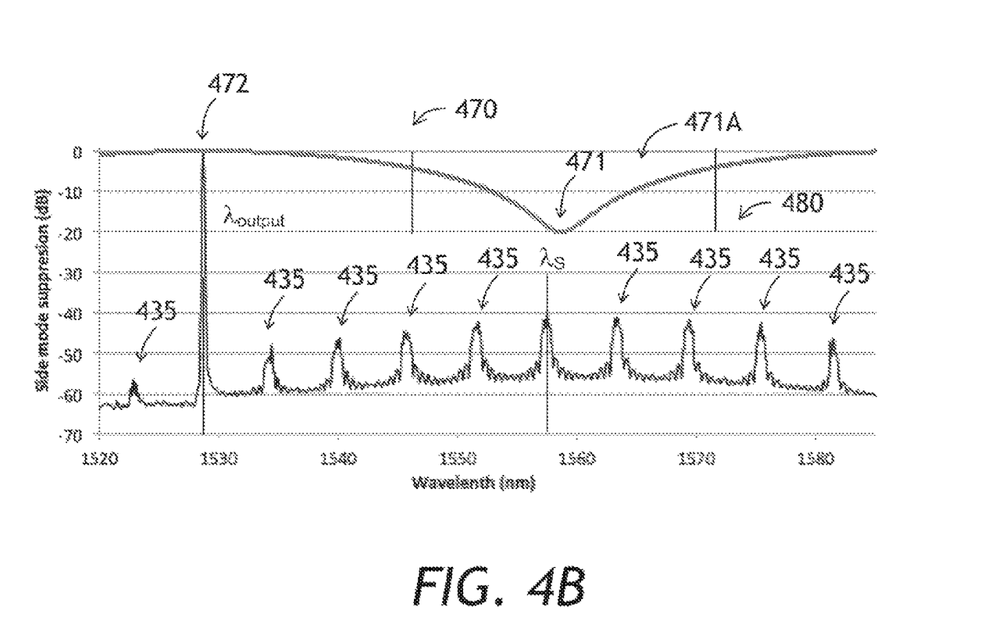
FIG. 4B illustrates a transmission spectrum of the asymmetric MZ interferometer of FIG. 4A superimposed with an emission spectrum of the amplified laser source of FIG. 4A if the asymmetric MZ interferometer were omitted from the amplified laser source.

Referring to FIG. 4B with further reference to FIG. 4A, the asymmetric Mach-Zehnder waveguide interferometer 404A (FIG. 4A) may be tuned by the phase adjusters 433 and 434 to have a transmission minimum 471 (FIG. 4B), corresponding to a center wavelength of a stopband 471A, at the sidelobe wavelength $\lambda_S$. It is also possible, and in fact more practical, to tune a transmission maximum 472 of the asymmetric Mach-Zehnder waveguide interferometer 404A to the lasing wavelength $\lambda_{output}$. These two conditions can be simultaneously achieved when the free spectral range of the asymmetric Mach-Zehnder waveguide interferometer 404A is twice the separation between $\lambda_{output}$ and $\lambda_S$. Since SMSR is typically most degraded at the short wavelength side of the tuning range of the monolithic laser device 400, it is desirable to select the free spectral range to be twice the separation between the shortest required lasing wavelength and $\lambda_S$ as shown in FIG. 4B.

Figure 4C:
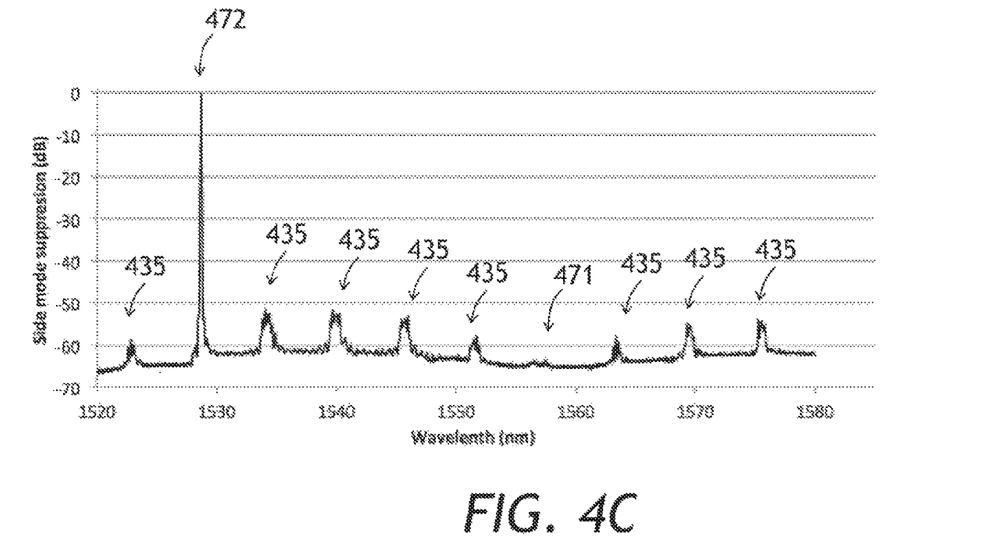
FIG. 4C illustrates an emission spectrum of the tunable laser device of FIG. 4A including the asymmetric MZ interferometer, showing suppression of side peaks in comparison with FIG. 4B.

For $\lambda_{output}$ corresponding to worst-case SMSR condition (FIG. 4B), the minimum transmission point 471 is preferably tuned to be close to a peak gain point of the SOA section 406 (FIG. 4A). The SOA section 406 typically has an approximately parabolic gain spectrum described by a peak gain at a center wavelength, falling off at other wavelengths with a roughly parabolic dependence. Because of this, an emission spectrum 480 of the tunable monolithic laser device 400, in the absence of the asymmetric Mach-Zehnder waveguide interferometer 404A, would include not only the Using wavelength $\lambda_{output}$, but also a plurality of side peaks 435 due to reflection of back-propagated ASE from the back mirror 412, as explained above. Referring to FIG. 4C with further reference to FIGS. 4A and 4B, the asymmetric Mach-Zehnder waveguide interferometer 404A (FIG. 4A) suppresses the side peaks 435 (FIG. 4C), especially those in the vicinity of the minimum transmission point 471 (FIGS. 4B, 4C), corresponding to the stopband 471A center wavelength. As seen by comparing FIGS. 4B and 4C, the SMSR improves from 40 dB to 50 dB, that is, by 10 dB.

From the perspective of spectral purity, a tunable transmission optical filter should have a narrow single-peak pass-band, less than the back mirror peak spacing of the laser device 300 or 400. A sharp transmission roll-off, low transmission in the stop band, and wide tunability across the entire amplification band of the SOA section 306 or 406 band are also desired. However, narrowband transmission optical filters are usually large in size. In contrast, broadband filters may be made more compact, simplifying monolithic integration of the tunable monolithic laser device 400 on a substrate, not shown. As an example, filters having a passband at 3 dB level of at least 40% of the free spectral range may be used. An asymmetric Mach Zehnder waveguide filter has a sinusoidal transmission spectrum with a 3 dB transmission bandwidth of half its free spectral range. Preferably, the free spectral range approximately equals twice the maximum detuning between the laser wavelength and the gain peak wavelength. This amounts to 50~60 nm for a full-band tunable laser.

Other types of tunable transmission optical filters may be monolithically integrated into the tunable monolithic laser device 300 of FIG. 3 and 400 of FIG. 4. By way of a non-limiting example, the tunable transmission optical filters 304 and 404 may include a grating-assisted co-directional coupler or a tunable multimode interference coupler.

Figure 5:
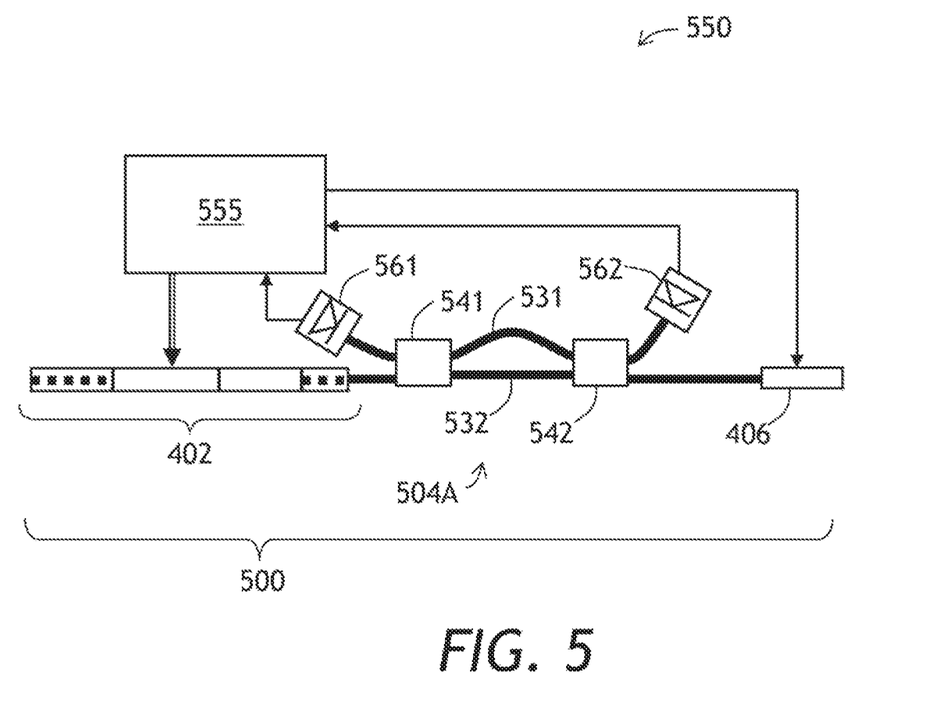
FIG. 5 illustrates a laser source according to one embodiment.

Referring now to FIG. 5, a laser source 550 includes a tunable monolithic laser device 500 coupled to a controller 555. The tunable monolithic laser device 500 is a variant of the tunable monolithic laser device 400 of FIG. 4A. The tunable monolithic laser device 500 of FIG. 5 may include the tunable laser section 402, an asymmetric tunable Mach-Zehnder waveguide interferometer 504A coupled to the tunable laser section 402, and the SOA section 406 coupled to the asymmetric tunable Mach-Zehnder waveguide interferometer 504A. The asymmetric tunable Mach-Zehnder waveguide interferometer 504A may include input 541 and output 542 couplers connected by a pair of branch waveguides 531 and 532. Preferably, one of, or both input 541 and output 542 couplets are 2×2 couplers, e.g. directional or 2×2 multimode interference couplers, so that optional first 561 and second 562 photodetectors may be coupled to free waveguides of the respective input 541 and output 542 2×2 couplers. The controller 555 may be operationally coupled to the tunable laser section 402, the Mach-Zehnder waveguide interferometer 504A, the SOA section 406, and the optional photodetectors 561 and 562. The controller 555 may be configured, e.g. programmed, to tune the lasing wavelength $\lambda_{output}$ of the tunable laser section 402, and to tune the center wavelength of the passband of the Mach-Zehnder waveguide interferometer 504A to correspond to the lasing wavelength $\lambda_{output}$. The Mach-Zehnder waveguide interferometer 504A may also be tuned to suppress the side peaks 435 (FIGS. 4B, 4C) to increase the SMSR. When the tree spectral range of the Mach-Zehnder waveguide interferometer 504A is properly selected, the conditions of sufficiently high transmission and sufficiently high SMSR may be satisfied simultaneously in most cases.

The Mach-Zehnder waveguide interferometer 504A is typically tuned by adjusting a tuning parameter such as the optical path length difference between the branch waveguides 531 and 532. As noted above, it may be more practical to merely maximize the output optical power at the lasing wavelength $\lambda_{output}$. To that end, the controller 555 may be configured to lessen an optical power level of light detected by the second photodetector 562. When the optical power level is minimized, all generated optical power is coupled to the SOA section 406, thus maximizing the transmission of the asymmetric tunable Mach-Zehnder waveguide interferometer 504A at the lasing wavelength $\lambda_{output}$. The controller 555 may also monitor the forward voltage of the SOA section 406, or the reverse photocurrent of the SOA section 406 (when the SOA section 406 is temporarily operated under reverse bias to function as a photodetector), to determine the Mach-Zehnder waveguide interferometer 504A tuning condition for maximum optical transmission.

Figure 6:
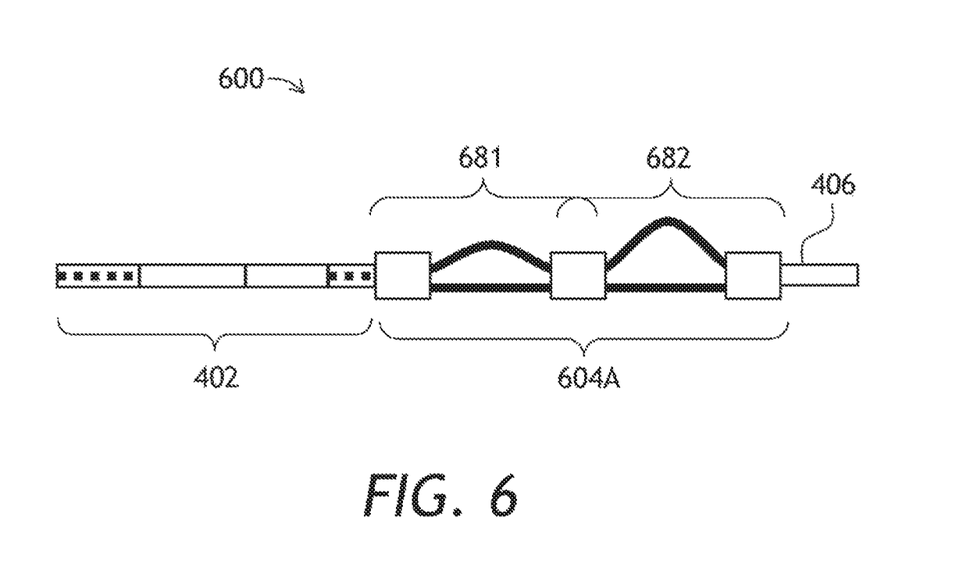
FIG. 6 illustrates an embodiment of a tunable laser device, having a cascaded MZ interferometer.

Different tunable filter geometries may be used to suppress back-propagating ASE from the SOA section 406. Turning to FIG. 6, a tunable monolithic laser device 600 is a variant of the tunable monolithic laser device 300 of FIG. 3, 400 of FIG. 4, or 500 of FIG. 5. The tunable monolithic laser device 600 of FIG. 6 includes the tunable laser section 402, an asymmetric cascaded tunable Mach-Zehnder waveguide interferometer 604A coupled to the tunable laser section 402, and the SOA section 406 coupled to the asymmetric cascaded tunable Mach-Zehnder waveguide interferometer 604A. The asymmetric cascaded Mach-Zehnder waveguide interferometer 604A may include, for example, first 681 and second 682 Mach-Zehnder stages. The cascaded Mach-Zehnder waveguide interferometer 604A may have a wider suppression spectral band than a single Mach-Zehnder interferometer, and thus it may provide a better SMSR. More than two stages, for example two, three and four stages, may be used.

To provide a high level of transmission at the lasing wavelength $\lambda_{output}$ while suppressing the side peaks 425 (FIGS. 4B and 4C), a free spectral range of the asymmetric tunable Mach-Zehnder waveguide interferometers 404A of FIG. 4A, 504A of FIG. 5, and 604A of FIG. 6 may be selected to be substantially equal to the tuning range $\Delta\lambda$. Another guideline may be to have the free spectral range substantially equal to twice a separation between the first wavelength $\lambda_1$ and a center of the amplification band of the SOA section 406. This allows one to maximize transmission at the lasing wavelength $\lambda_{output}$, while suppressing the side peaks 425 where the side peaks 425 are the strongest—see, for example, FIG. 4C.

Figure 7:
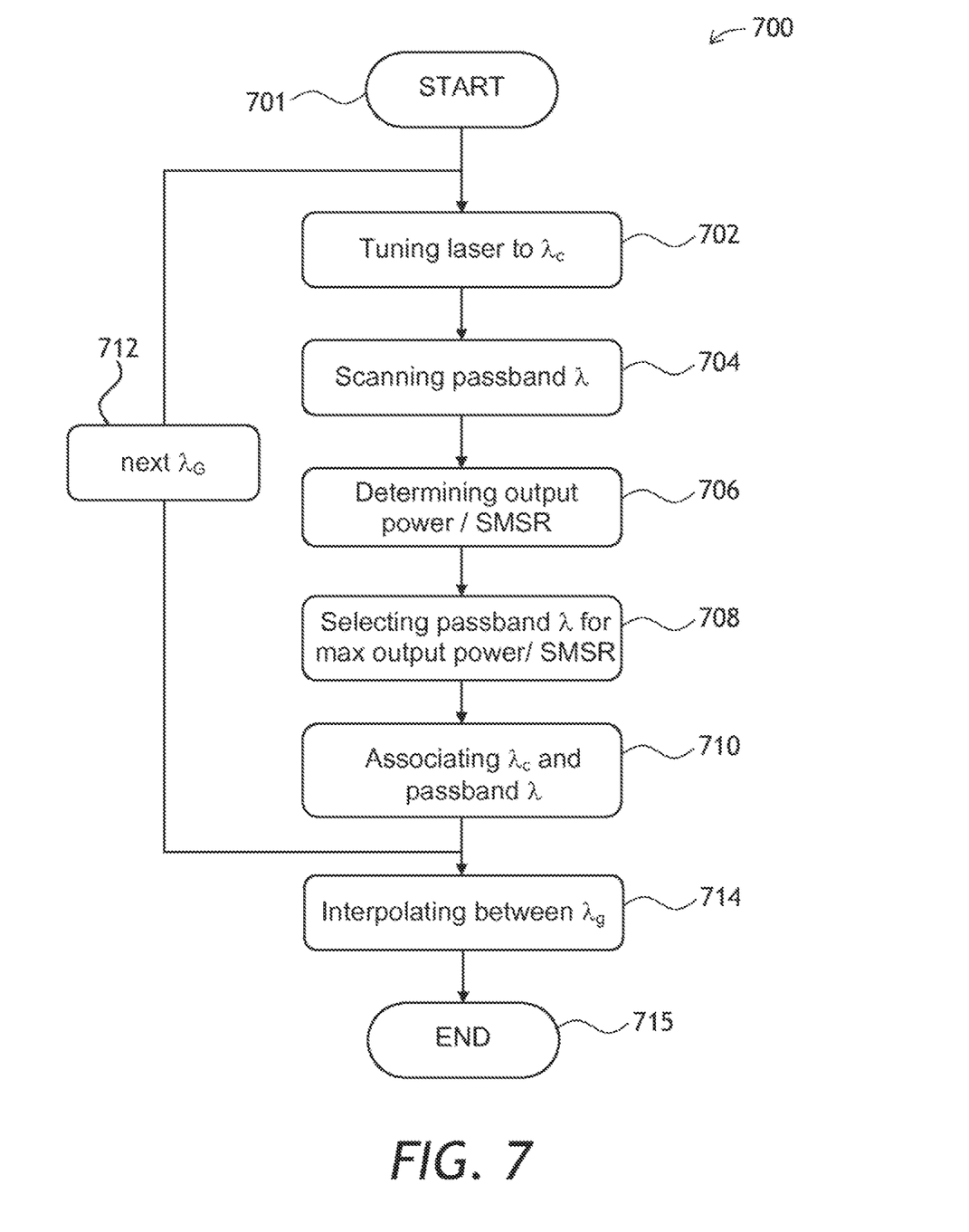
FIG. 7 illustrates an exemplary method for calibrating a laser source of FIGS. 3, 4A, 5, and 6.

Method of calibration and operation of a tunable laser device comprising coupled in sequence a tunable laser section, a tunable transmission optical filter, and a semiconductor optical amplifier section e.g. the laser device 300 of FIG. 3, 400 of FIG. 4, the laser source 550 of FIG. 5, or the laser device 600 of FIG. 6 will now be considered. Referring to FIG. 7, a method 700 for calibrating e.g. the laser source 550 of FIG. 5 starts at 701. In a step 702, the lasing wavelength $\lambda_{output}$ may be tuned to a calibration wavelength $\lambda_C$ within the inning range $\Delta\lambda$. When the step 702 is completed, then in a next step 704, the passband center wavelength of the asymmetric Mach-Zehnder interferometer 504A may be scanned in a step 704 by adjusting a tuning parameter, such as a tuning current or voltage applied to the phase adjusters 433 and/or 434. As the passband center wavelength is scanned, the controller 555 determines the current output optical power and/or the current SMSR in a step 706. When the scanning is complete, then the controller 555 selects in a step 708 a value of the tuning parameter scanned in the scanning step 704, and/or a value of the center wavelength scanned in the step 704, corresponding to a maximum output optical power and/or maximum SMSR determined in the SMSR calculation step 706. Then, in a step 710, the value of the tuning parameter and/or the value of the center wavelength selected in the step 708 may be associated with the calibration wavelength tuned to in the first step 702. The steps 702 to 710 may be repeated in a step 712 for a grid of calibration wavelengths $\lambda_G$. For a wavelength within the tuning range $\Delta\lambda$ but not equal to any of the grid calibration wavelengths $\lambda_G$ of the step 712, a value of the corresponding tuning parameter and/or the value of the center wavelength may be determined in a step 714 by interpolation between two nearest calibration wavelengths $\lambda_G$ of the grid. The method 700 ends at 715. As explained above, when the free spectral range of the asymmetric Mach-Zehnder interferometer 504A is properly selected, determining maximum output optical power (step 706) may be sufficient for optimizing SMSR.

Figure 8:
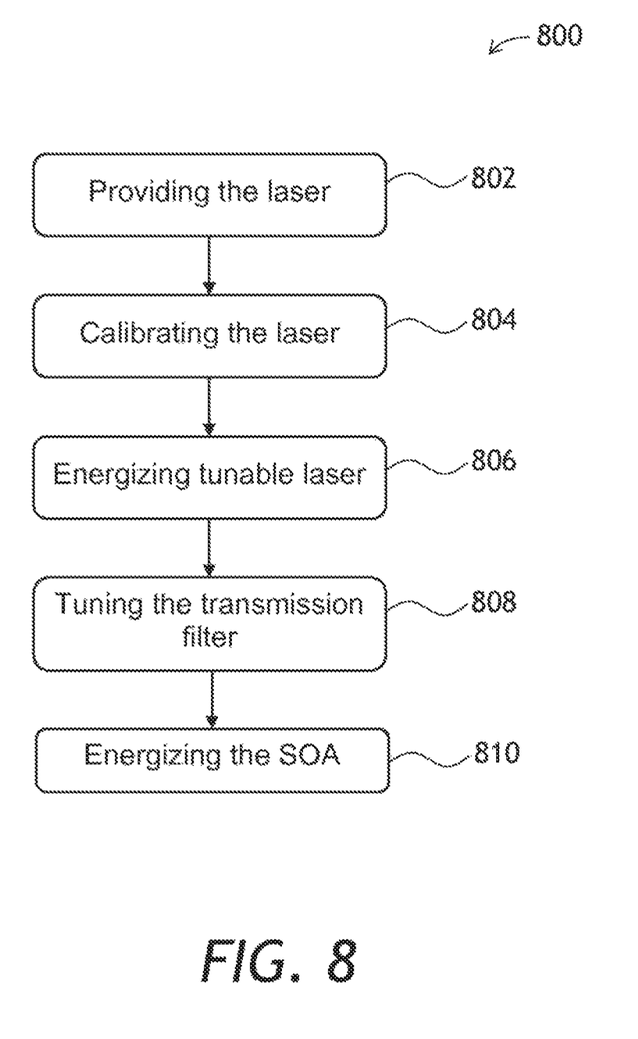
FIG. 8 illustrates an exemplary method for generating light using e.g. a laser source of FIGS. 3, 4A, 5, and 6.

Turning to FIG. 8, an embodiment of a method 800 for generating light includes a step 802 of providing a tunable laser device comprising coupled in sequence a tunable laser section, a tunable transmission optical filter, and a semiconductor optical amplifier section, e.g. the laser device 300 of FIG. 3, 400 of FIG. 4, or 500 of FIG. 5; 600 of FIG. 6; or providing the laser source 550 of FIG. 5. The laser devices 300, 400, 500, 550, or 600 may be calibrated in a step 804 using the method 700 of FIG. 7. In a next step 806, the laser may be energized; and the lasing wavelength $\lambda_{output}$ may be tuned to a first working wavelength within the tuning range $\Delta\lambda$. Then, in a step 808, the center wavelength of the stopband of the tunable transmission optical filter 304 or 404 may be tuned so as to increase the output optical power and/or the SMSR at the first working wavelength. The SOA section 406 may be energized in a step 810. In an embodiment where tuning the tunable transmission optical filter 304 or 404 in the step 808 causes a maximum transmission wavelength to not be equal to the first working wavelength, resulting in an extra optical loss in the tunable transmission optical filter 304 or 404, the SOA section 406 may be energized in the step 810 to a level of amplification sufficient to compensate for the extra optical loss. Should a closed-loop control be required to compensate for aging-induced drifts of the laser devices 300, 400, 500, 550, or 600, a dither of a phase of the tunable transmission optical filter 304, 404 about the bias condition can be applied to stay locked to a local minimum or maximum of a parameter being monitored, such as output optical power, SOA current, SMSR, etc.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gale array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method comprising:
   tuning a lasing wavelength of a tunable laser section to a calibration wavelength within a tuning range of the tunable laser section,
     the tunable laser section being included in a tunable laser device, and
     the tunable laser device including a tunable transmission optical filter and a semiconductor optical amplifier section;
   scanning, based on tuning the lasing wavelength of the tunable laser section to the calibration wavelength, a center wavelength of a passband of the tunable transmission optical filter;
   determining, based on scanning the center wavelength, an output optical power of a laser source or a side mode suppression ratio of the laser source;
   selecting a value of the center wavelength corresponding to the determined output optical power or the determined side mode suppression ratio; and
   associating the value of the center wavelength with the calibration wavelength.

2. The method of claim 1, further comprising:
   tuning the lasing wavelength of the tunable laser section to another calibration wavelength in a grid of calibration wavelengths;
   scanning another center wavelength of the passband of the tunable transmission optical filter based on tuning the lasing wavelength of the tunable laser section to the other calibration wavelength;
   determining, based on scanning the other center wavelength, another output optical power of the laser source or another side mode suppression ratio of the laser source;
   selecting another value of the other center wavelength corresponding to the determined other output optical power or the determined other side mode suppression ratio; and
   associating the other value of the other center wavelength with the other calibration wavelength.

3. The method of claim 2, further comprising:
   interpolating, for an additional calibration wavelength, the value of the center wavelength and the other value of the other center wavelength to determine an additional value of an additional center wavelength,
     the additional center wavelength being within the tuning range of the tunable laser section.

4. The method of claim 3, where the additional calibration wavelength is not included in the grid of calibration wavelengths.

5. The method of claim 3, further comprising:
associating the additional value of the additional center wavelength with the additional calibration wavelength based on interpolating to determine the additional value of the additional center wavelength.

6. The method of claim 1, further comprising:
providing the tunable laser device,
where tuning the lasing wavelength of the tunable laser comprises:
tuning the lasing wavelength of the tunable laser based on providing the tunable laser device.

7. The method of claim 1, further comprising:
energizing the tunable laser section after associating the value of the center wavelength with the calibration wavelength;
energizing the tunable laser section and tuning the lasing wavelength to a first working wavelength within the tuning range of the tunable laser section;
tuning, based on energizing the tunable laser section, the center wavelength of the passband of the tunable transmission optical filter to increase the side mode suppression ratio at the first working wavelength; and
energizing, based on tuning the center wavelength of the passband, a semiconductor optical amplifier section.

8. An apparatus comprising:
a semiconductor optical amplifier section;
a tunable transmission optical filter; and
a tunable laser section,
the tunable laser section being calibrated to associate a value of a center wavelength of a passband of the tunable transmission optical filter with a calibration wavelength within a tuning range of the tunable laser section, and
the value of the center wavelength being selected based on a maximum output optical power or a maximum side mode suppression ratio associated with a scan of the center wavelength of the passband of the tunable transmission optical filter performed based on tuning the tunable laser section to the calibration wavelength.

9. The apparatus of claim 8, where the tunable laser section is calibrated to a grid of calibration wavelengths.

10. The apparatus of claim 8, where
the tunable laser section is calibrated to a particular calibration wavelength between a first calibration wavelength to which the tunable laser section is calibrated and a second calibration wavelength to which the tunable laser section is calibrated, and
the tunable laser section is calibrated to the particular calibration wavelength based on an interpolation associated with the first calibration wavelength and the second calibration wavelength.

11. The apparatus of claim 8, where the tunable laser section, the tunable transmission optical filter, and the semiconductor optical amplifier section are optically coupled in sequence.

12. The apparatus of claim 8, where the tunable laser section is configured to be energized based on being calibrated.

13. The apparatus of claim 8, where the semiconductor optical amplifier section is configured to be energized after tuning the center wavelength of the passband to increase a side mode suppression ratio after energizing the tunable laser section.

14. The apparatus of claim 8, where the tunable transmission optical filter further comprises:
a stopband to attenuate light at a particular wavelength,
the particular wavelength being different from a lasing wavelength that the passband is calibrated to transmit.

15. A method comprising:
providing a tunable laser device,
the tunable laser device comprising a semiconductor optical amplifier section, a tunable transmission optical filter, and a tunable laser section, and
the tunable laser device being calibrated to associate a value of a center wavelength of a passband of the tunable transmission optical filter with a calibration wavelength within a tuning range of the tunable laser section;
energizing the tunable laser section and tuning a lasing wavelength to a working wavelength within the tuning range of the tunable laser section;
tuning, based on energizing the tunable laser section, the center wavelength of the passband of the tunable transmission optical filter to increase a side mode suppression ratio at the working wavelength; and
energizing, based on tuning the center wavelength of the passband, the semiconductor optical amplifier section.

16. The method of claim 15, where
the tunable transmission optical filter is associated with an optical loss at the working wavelength and
energizing the semiconductor optical amplifier section comprises:
energizing the semiconductor optical amplifier section to a particular level of amplification,
the particular level of amplification compensating for the optical loss at the working wavelength.

17. The method of claim 15, further comprising:
calibrating tunable laser device based on providing the tunable laser device.

18. The method of claim 17, where calibrating the tunable laser device comprises:
tuning the lasing wavelength to the calibration wavelength;
scanning, based on tuning the lasing wavelength to the calibration wavelength, the center wavelength of the passband of the tunable transmission optical filter;
determining, based on tuning the lasing wavelength of the tunable laser section to the calibration wavelength, an output optical power of a laser source or another side mode suppression ratio of the laser source;
selecting the value of the center wavelength corresponding to a maximum output optical power or a maximum side mode suppression ratio; and
associating the value of the center wavelength with the calibration wavelength.

19. The method of claim 15, where the tunable transmission optical filter is an asymmetric Mach-Zehnder waveguide interferometer.

20. The method of claim 15, where tuning the center wavelength of the passband comprises:
tuning the center wavelength of the passband to increase an output optical power at the working wavelength.

* * * * *